United States Patent
Philipp

(10) Patent No.: US 7,515,140 B2
(45) Date of Patent: Apr. 7, 2009

(54) CAPACITIVE SENSOR

(75) Inventor: Harald Philipp, Hamble (GB)

(73) Assignee: Atmel Corporation, San Jose, CA (US)

( * ) Notice: Subject to any disclaimer, the term of this patent is extended or adjusted under 35 U.S.C. 154(b) by 534 days.

(21) Appl. No.: 11/056,781

(22) Filed: Feb. 11, 2005

(65) Prior Publication Data

US 2005/0179673 A1 Aug. 18, 2005

Related U.S. Application Data

(60) Provisional application No. 60/544,371, filed on Feb. 13, 2004.

(51) Int. Cl.
*G06F 3/041* (2006.01)
(52) U.S. Cl. .................. 345/173; 178/18.06; 200/600
(58) Field of Classification Search .............. 345/173; 261/288; 211/120; 200/511, 600, 516, 532; 178/18.06
See application file for complete search history.

(56) References Cited

U.S. PATENT DOCUMENTS

| | | | | |
|---|---|---|---|---|
| 3,414,268 A | * | 12/1968 | Chase | ............ 473/396 |
| 3,659,897 A | * | 5/1972 | Wright | ............ 297/337 |
| 4,458,293 A | * | 7/1984 | Cherry | ............ 341/33 |
| 5,087,825 A | | 2/1992 | Ingraham | |
| 5,917,165 A | * | 6/1999 | Platt et al. | ............ 200/600 |
| 6,664,489 B2 | | 12/2003 | Kleinhaus et al. | |

FOREIGN PATENT DOCUMENTS

| | | |
|---|---|---|
| DE | 201 19 700 U1 | 3/2002 |
| EP | 0858166 B1 | 3/2000 |
| WO | WO 00/31553 | 6/2000 |

* cited by examiner

*Primary Examiner*—Amr Awad
*Assistant Examiner*—Jeff Pelligrino
(74) *Attorney, Agent, or Firm*—David Kiewit

(57) ABSTRACT

A capacitive sensor for detecting the presence of an object adjacent a panel is described. The sensor comprises an electrically conducting sensor element coupled to a capacitance measurement circuit. In use, the capacitive sensor is mounted with the sensor element adjacent an underside of the panel. The sensor element includes a flared portion which deforms when pressed against the panel to provide an extended contact area between the sensor element and the panel. When a user touches an upper side of the panel above the extended contact area, the capacitance of the sensor element is modified. This is detected by the measurement circuit and identifies a touch.

6 Claims, 3 Drawing Sheets

CAPACITIVE SENSOR

This application claims the priority of the Applicant's provisional application for patent, Ser. No. 60/544,371, filed Feb. 13, 2004.

BACKGROUND OF THE INVENTION

The invention relates to capacitive sensors, in particular the invention relates to touch sensitive capacitive sensors for detecting the presence of an object, such as a user's finger, adjacent a panel.

Capacitive sensors have become increasingly common and accepted for use in human interfaces and for machine control. In the field of home appliances it is now quite common to find capacitive touch controls operable through glass or plastic panels.

Touch sensitive control panels generally comprise a capacitive sensor mounted behind a panel. The capacitive sensor comprises a conductive sensor element in contact with the panel and a measurement circuit for determining the capacitance of the sensor element. The configuration of the sensor element defines the sensitive area of the capacitive sensor. The capacitance of the sensor element is modified by the presence of a user's finger positioned adjacent the panel above the sensitive area. Accordingly, a touch is identified by a measured change in this capacitance.

A known type of capacitive sensor employs a conductive area attached to an underside of a panel as the sensor element. The conductive area may be metal foil or a separate printed circuit board containing metal tracks that form the conductive area. The conductive sensor element on the underside of the touch panel is then electrically connected to the measurement circuit by a contact part. Examples of contact parts used in this type of prior art to connect the measurement circuit with the conductive sensor element on the underside of the touch panel are helical springs, conductive rubber pillars and plug-and-socket arrangements. An example of this kind of sensor is disclosed in DE 201 19 700 Al.

Another known type of capacitive sensor, as described by Platt in U.S. Pat. No. 5,917,165, comprises a touch contact switch with an electrically conductive foam, flexible plastic or rubber body held in compression between the underside of a touch panel and an underlying circuit board. The face of the conductive foam in contact with the panel acts as a sensor element while the conductive rubber body electrically connects to the measurement circuit. This arrangements avoids the need for a separate printed circuit board or conductive foil to form the sensor element. Ingraham, in U.S. Pat. No. 5,087,825, describes a sensor similar to that of Platt.

BRIEF SUMMARY OF THE INVENTION

According to a first aspect of the invention there is provided a capacitive sensor for detecting the presence of an object adjacent a panel comprising: an electrically conducting sensor element which may be positioned against the panel, the sensor element being coupled to a measurement circuit operable to determine a capacitance of the sensor element, said capacitance being modified by the presence of an object, wherein the sensor element includes a flared portion which deforms when pressed against the panel so as to provide an extended contact area between the sensor element and the panel.

The extended contact area provided by the flared portion allows for an extended sensitive area and increased capacitive coupling between the object and the sensor element over what would otherwise be possible. This is achieved with a relatively compact design because the sensitive surface area provided by the deformed flared portion is not maintained along the full length of the sensor element. In some examples the sensor element may be flared along its whole length, but in general the flared portion will extend along only a part of the length.

The flared portion may be resilient so as to provide a positive contact force between the sensor element and the panel during use.

In some embodiments, the sensor element comprises a helical spring, which may be formed from spring steel, having a diameter which increases along at least a part of its length to define the flared portion.

A spring-type sensor element is easy to manufacture and has low production costs. An end of the spring comprising the sensor element may be formed into a tab which may be soldered to a printed circuit board supporting the sensor element. This provides both a good mechanical and a good electrical connection and allows easy assembly.

In some embodiments, the sensor element may include a plurality of flexible leaves for defining the flared portion. These can be easily formed by providing cut-outs along a part of the length of the sensor element. Such a sensor element may also be formed with a tab for soldering to a printed circuit board.

The sensor element may advantageously have a longitudinal opening running along its length. This allows the panel to be back lit through the sensor element using a light source, for example a light emitting diode (LED) arranged below, or sleeved in, the longitudinal opening. The LED or other light source may thus also serve as a structural element to locate the sensor element during assembly and to keep it aligned after mounting.

According to a second aspect of the invention there is provided a capacitive sensor apparatus comprising: a touch panel having an upper side and an under side; a support arranged below the underside of the touch panel; and a sensor element made of a spring extending from the support to the underside of the touch panel where the spring has a flared portion that is flattened under compression to form an extended contact area on the underside of the touch panel.

The flared spring provides a progressively sprung structure with a stronger lower portion proximate the support and a weaker upper portion, the flared portion, proximate the underside of the touch panel. The flared portion can then flatten against the panel while the lower portion substantially retains its unstrained dimensions. The stronger lower portion can be of substantially constant lateral dimension. The preferred solution is provided by a helical spring used to form both the upper and lower portions. An alternative solution involves the spring being made of flexible leaves that can spread over the underside of the touch panel. An advantage of the resilient sensor element is that it can be made of metal and soldered or otherwise bonded to the support so that it forms a reliable ohmic contact. The sensor element can be used as the sole sensing part so there is no need for any electrodes to be embedded in the touch panel nor for a separate board contacting the touch panel. The touch panel can thus be formed of non-conductive material proximate the resilient sensor element.

Capacitive sensors according to aspects of the invention find many applications. They can be used in control panels for a whole host of devices such as domestic appliances, telephones, games consoles, personal digital assistants (PDAs), and consumer electronic devices. They can be used, for example, as numeric key pads, as touch sensitive displays, as power controls, or for providing any other switching or selection functions.

Although it is believed that the foregoing rather broad summary description may be of use to one who is skilled in the art and who wishes to learn how to practice the invention, it will be recognized that the foregoing recital is not intended to list all of the features and advantages. Those skilled in the art will appreciate that they may readily use both the underlying ideas and the specific embodiments disclosed in the following Detailed Description as a basis for designing other arrangements for carrying out the same purposes of the present invention and that such equivalent constructions are within the spirit and scope of the invention in its broadest form. Moreover, it may be noted that different embodiments of the invention may provide various combinations of the recited features and advantages of the invention, and that less than all of the recited features and advantages may be provided by some embodiments.

BRIEF DESCRIPTION OF THE SEVERAL VIEWS OF THE DRAWING

For a better understanding of the invention and to show how the same may be carried into effect reference is now made by way of example to the accompanying drawings in which.

DETAILED DESCRIPTION OF THE INVENTION

In studying this Detailed Description, the reader may be aided by noting definitions of certain words and phrases used throughout this patent document. Wherever those definitions are provided, those of ordinary skill in the art should understand that in many, if not most instances, such definitions apply to both preceding and following uses of such defined words and phrases. At the outset of this Description, one may note that the terms "include" and "comprise," as well as derivatives thereof, mean inclusion without limitation; and the term "or," is inclusive, meaning and/or. Moreover, although the ensuing description and associated drawing describe only a commonly used orientation of capacitive sensor apparatus, this is done only in the interest of clarity of presentation. The reader will recognize that the apparatus of the invention can be used in essentially any orientation, such as having the sensor disposed behind a vertical cover panel, and that no particular limitation of the invention are to be inferred from the use of position designating words such as 'above', 'below', etc.

Figure 1:
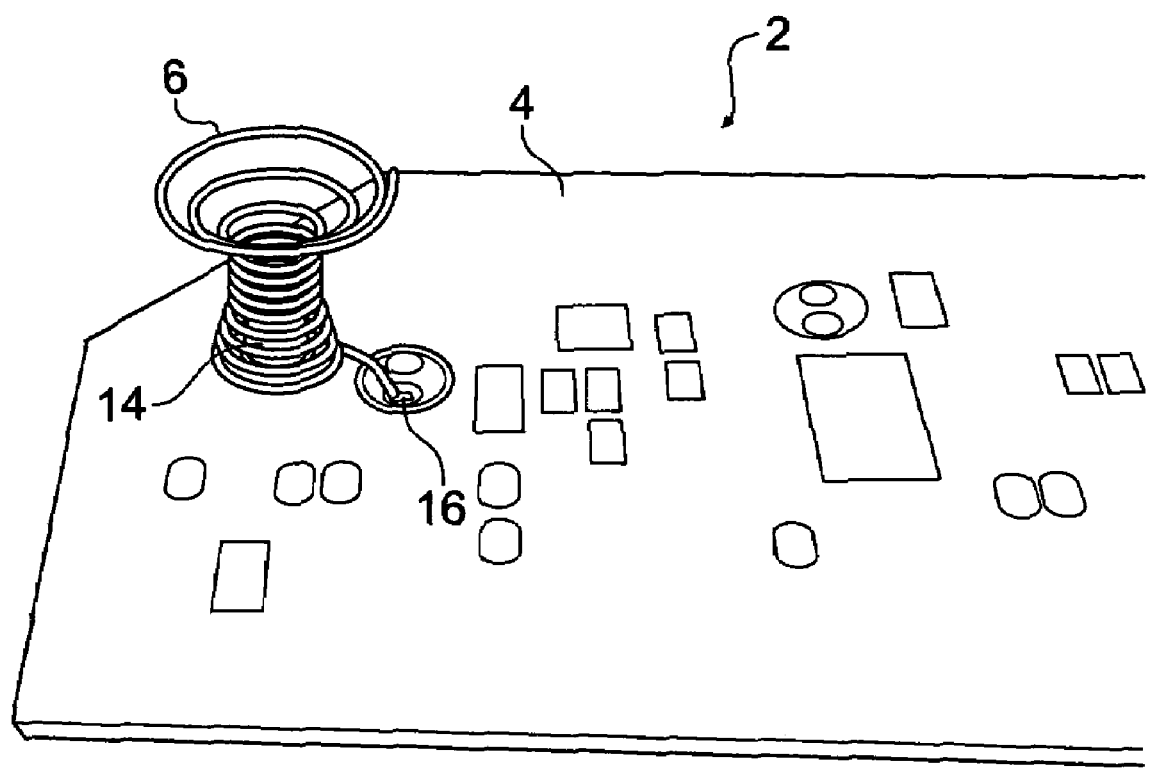
FIG. 1 schematically shows in perspective view a capacitive sensor according to a first embodiment of the invention.

FIG. 1 schematically shows in perspective view a capacitive sensor 2 according to a first embodiment of the invention. The capacitive sensor 2 comprises a sensor element 6 mounted on a printed circuit board (PCB) 4 which forms a support. In use the capacitive sensor 2 is mounted below the underside of a touch panel (not shown in FIG. 1). The exemplar sensor element 6 is connected to the PCB 4, both mechanically and electrically, by a soldered connection 16. The PCB contains a measurement circuit for measuring the capacitance of the sensor element 6. In this embodiment the measurement circuit employs charge transfer techniques, examples of which are well documented by the Applicant in his WO 00/31553 A1 and which are not described here further. It will, however, be appreciated that other types of capacitance measurement circuit may equally be employed. The preferred sensor element has a central longitudinal opening and a light emitting diode (LED) 14 is mounted within this opening. In addition to acting as an indicator light the LED 14 assists in maintaining alignment of the sensor element.

Figure 2:
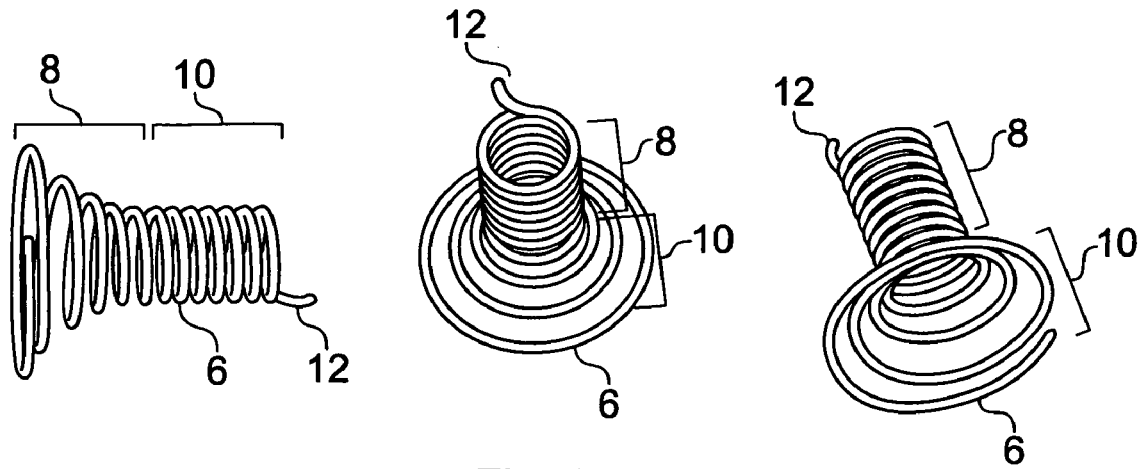
FIG. 2 schematically shows three perspective views of a sensor element of the capacitive sensor of FIG. 1.

FIG. 2 schematically shows three perspective views of the sensor element 6 of the capacitive sensor shown in FIG. 1. The sensor element 6 is formed from a metallic helical spring. The spring increases in diameter along a part of its length such that the sensor element 6 comprises a base portion 10 and a flared portion 8. A section of the spring forming at the end of the base portion 10 is unwound to form a tab 12. The tab 12 includes a kink so that its end can be positioned in a hole in the PCB 4 and assist in forming the soldered joint 16. This ensures a good electrical connection between the sensor element 6 and the measurement circuit on the PCB 4. In a typical application the base portion will have an inner diameter of around 4 mm and a length of around 8 mm with the flared portion opening up to a diameter of around 11 mm over a length of around 3 mm. It will be appreciated that the dimensions of the sensor element 6 will be different for different applications, depending on, for example, the desired size and/or sensitivity of sensitive area.

Figure 3:
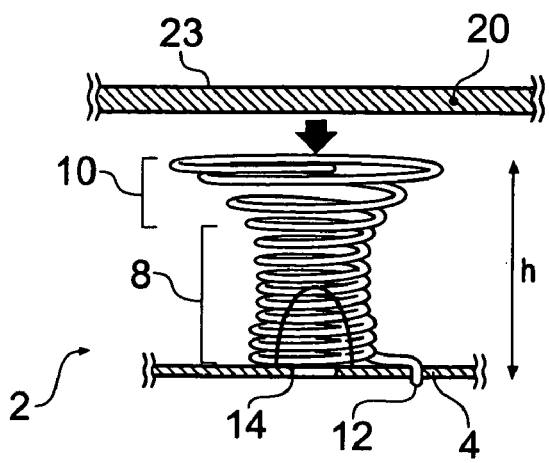
FIG. 3 schematically shows in vertical section view the capacitive sensor of FIG. 1 being approached by a cover panel.

FIG. 3 schematically shows in vertical section view the capacitive sensor 2 of FIG. 1 being approached by a covering touch panel 20. The sensor element has a free height h. The cover panel in this example is a glass panel having an upper side 23 for touching by a user.

Figure 4:
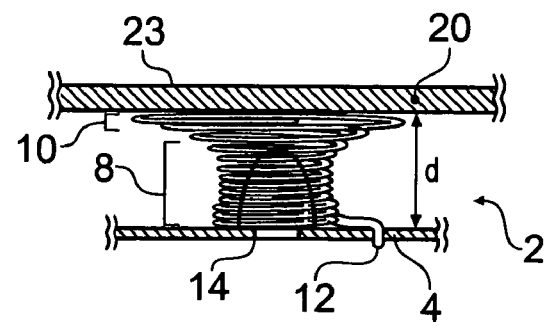
FIG. 4 schematically shows in vertical section view the capacitive sensor of FIG. 1 with a cover panel in place.

FIG. 4 schematically shows in vertical section view the capacitive sensor 2 of FIG. 1 with the cover panel 20 in place. The cover panel 20 is positioned a distance d from the PCB 4, so as to compress the spring comprising the sensor element 6 to this height against its underside. In use, the PCB 4 and the panel 20 are fixed relative to one another. This may be achieved, for example, by mounting the PCB 4 directly on the cover panel 20 or by mounting the PCB 4 and cover panel 20 independently on a chassis. As the spring is compressed from its free height h to its compressed height d, successive ones of the upper turns of the spring are brought into contact with the underside of the cover panel 20, thus providing an extended contact area between the sensor element 6 and the control panel 20. In a typical application a sensor element comprising a spring having a free height h of around 11 mm might be compressed in use to a height d of around six mm under a load of around one Newton.

Figure 5:
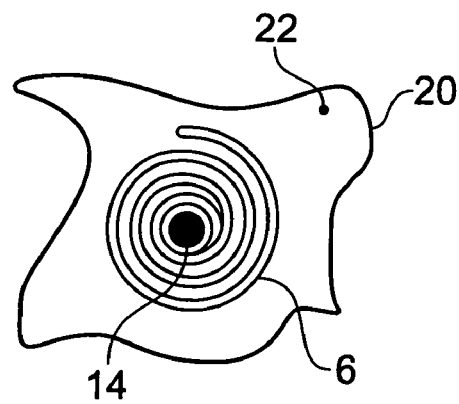
FIG. 5 schematically shows in plan view the capacitive sensor and cover panel of FIG. 4.

FIG. 5 is a schematic plan view of the capacitive sensor 2 and cover panel 20 shown in FIG. 4. A number of turns of the spring comprising the sensor element 6 can be seen to contact the cover panel 20.

The extended contact area provided by the flared portion 10 is important since it provides for an extended sensitive area and increased capacitive coupling to a user's finger when touching the cover panel. In addition the resilience of the spring ensures a good contact with the cover panel. A spring-type sensor element is also easy to manufacture and has low production costs. The soldered joint 16 provides a reliable and robust electrical and mechanical connection to the PCB 4 and associated measurement circuit and provides for easy assembly. The shape of the spring also provides a natural opening in which the LED 14 may be mounted.

Figure 6:
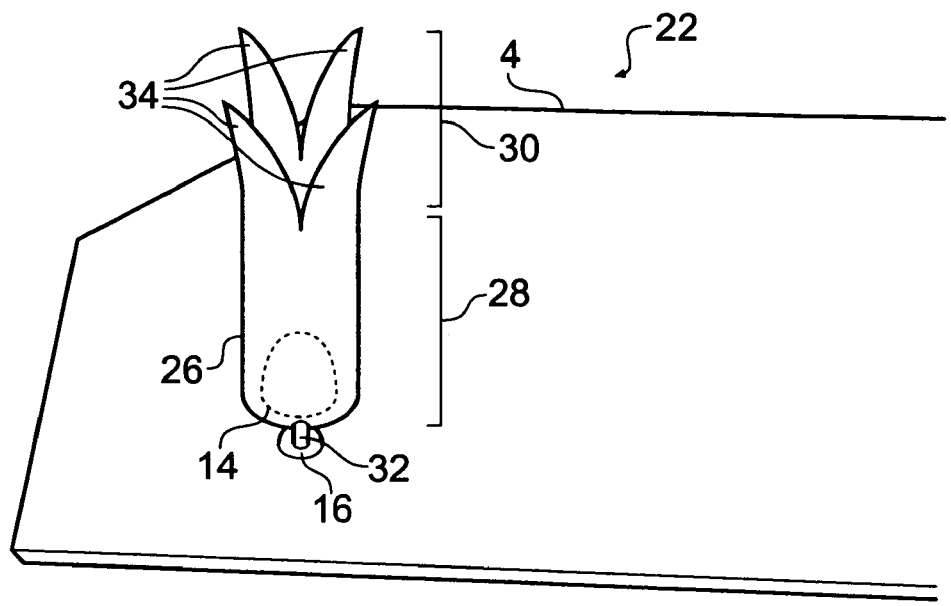
FIG. 6 schematically shows in perspective view a capacitive sensor according to a second embodiment of the invention.

FIG. 6 schematically shows, in perspective view, a capacitive sensor 22 according to a second embodiment of the invention. Parts of the capacitive sensor 22 which correspond to parts of the capacitive sensor 2 of FIG. 1 are given the same reference numeral and are not described again for brevity. The capacitive sensor 22 includes a sensor element 26 which differs from the sensor element 6 of FIGS. 1 to 5. The sensor element 26 includes a base portion 28 and a flared portion 30. The base portion 28 is formed from a metallic tube. The base portion 28 includes a tab 32, shown in FIG. 6 by broken lines, which assists in soldering the sensor element 26 to the PCB 4. The flared portion comprises a plurality of flexible leaves 34 angled away from an axis of the sensor element 26. The leaves 34 in this example are formed integrally with the base portion. In this embodiment there are four leaves 34 comprising the flared portion 30. In other examples there may be more or fewer. In a typical application the base portion will have an inner diameter of around 4 mm and a length of around 6 mm with the flared portion opening up to a width of around 11 mm over a length of around 5 mm. However, it will be appreciated that the dimensions of the sensor element 26, and the number of leaves 34, will be different for different applications, depending on, for example, the desired size, shape and/or sensitivity of sensitive area.

Figure 7:
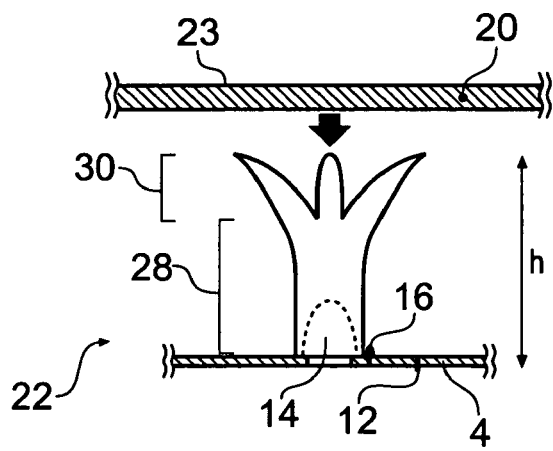
FIG. 7 schematically shows in vertical section view the capacitive sensor of FIG. 6 being approached by a cover panel.

FIG. 7 is similar to FIG. 3 and schematically shows in vertical section view the capacitive sensor 22 of FIG. 6 being approached by a cover panel 20. The sensor element 26 has a free height h.

Figure 8:
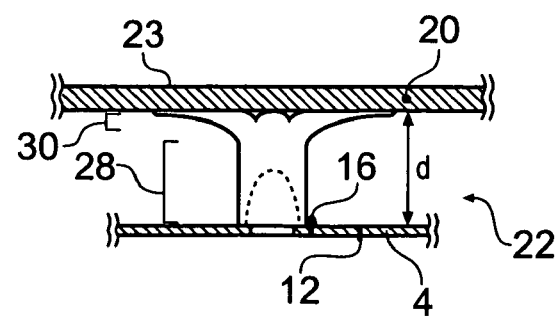
FIG. 8 schematically shows in vertical section view the capacitive sensor of FIG. 6 with a cover panel in place.

FIG. 8 is similar to FIG. 4 and schematically shows in vertical section view the capacitive sensor 22 of FIG. 6 with the cover panel 20 in place. The cover panel 20 is positioned a distance d from the PCB supporting the sensor element 26 and compresses the sensor element 26 to this height. As the sensor element 26 is compressed from its free height h to its compressed height d, the flexible leaves are deflected away from the axis of the sensor element, thus providing an extended contact area between the sensor element and the control panel.

Figure 9:
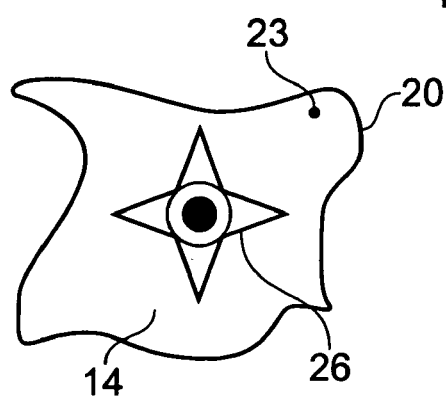
FIG. 9 schematically shows in plan view the capacitive sensor and cover panel of FIG. 8.

FIG. 9 is similar to FIG. 5 and is a schematic plan view of the capacitive sensor 22 and cover panel 20 shown in FIG. 8. The flexible leaves 34 can be seen to contact the cover panel 20 over an extended area. As with the first embodiment, the extended contact area between the sensor element 26 and the control panel 20 allows for an extended sensitive area and increased capacitive coupling to a user's finger when touching the cover panel than would otherwise be provided. In addition, the resilience of the flexible leaves ensures a good contact with the cover panel is made.

Although the present invention has been described with respect to several preferred embodiments, many modifications and alterations can be made without departing from the invention. Accordingly, it is intended that all such modifications and alterations be considered as within the spirit and scope of the invention as defined in the attached claims.

What is claimed is:

1. A capacitive sensor apparatus comprising:
   a measurement circuit for measuring a capacitance of a conductive area;
   a non-conductive touch panel having a first side for receiving a user's touch and a second side facing a support fixedly arranged at a selected distance from the touch panel so that the touch panel and the support are fixed relative to one another during operation; and
   a metal sensor element comprising a spring compressed between the support and the second side of the touch panel, the spring having an uncompressed length greater than the selected distance, the spring having a flared portion that is flattened under compression to form the conductive area on the second side of the touch panel, the spring further comprising a base portion that is stronger than the flared portion and that is connected to the measurement circuit at the support.

2. The apparatus of claim 1, wherein the spring is formed of helical coils.

3. The apparatus of claim 1, wherein the base portion of the spring comprises a tubular portion and wherein the flared portion of the spring comprises a plurality of flexible leaves extending away from an axis of the tubular portion.

4. The apparatus of claim 1, wherein the support is a circuit board.

5. The apparatus of claim 4, wherein the circuit board carries at least a part of the measurement circuit.

6. A method of making a capacitive sensor for sensing the presence of an object adjacent a sensitive area of a non-conducting panel, the method comprising the steps of:
   providing the panel;
   providing a metal sensor element having a selected free length, the sensor element comprising a stronger base portion at one end thereof and a weaker flared portion at a second end thereof;
   connecting, at a support member, the base portion of the sensor element to a capacitive measurement circuit operable to sense the presence of the object;
   moving the support member toward the panel until the support member and the panel are separated by a distance less than the free length, so as to compress the flared portion of the sensor element against the panel and thereby define the sensitive area; and
   fixing the support member relative to the touch panel at the distance less than the free length.

* * * * *